United States Patent [19]

Nath et al.

[11] Patent Number: 4,483,883
[45] Date of Patent: Nov. 20, 1984

[54] UPSTREAM CATHODE ASSEMBLY

[75] Inventors: Prem Nath, Rochester; Masatsugu Izu, Birmingham, both of Mich.

[73] Assignee: Energy Conversion Devices, Inc., Troy, Mich.

[21] Appl. No.: 549,054

[22] Filed: Nov. 7, 1983

Related U.S. Application Data

[63] Continuation-in-part of Ser. No. 452,224, Dec. 22, 1982.

[51] Int. Cl.³ .............................................. B05D 3/06
[52] U.S. Cl. ..................................................... 427/39
[58] Field of Search .................. 118/718, 719; 427/39

[56]  References Cited

U.S. PATENT DOCUMENTS 4,262,631  4/1981  Kubacki .............................. 118/723
4,282,267  4/1981  Kuyel ..................................... 427/38

*Primary Examiner*—Bernard D. Pianalto
*Attorney, Agent, or Firm*—Marvin S. Siskind; Ronald W. Citkowski

[57] ABSTRACT

An upstream or predeposition cathode system for use with glow discharge deposition apparatus, said apparatus adapted for the continuous production of large area photovoltaic devices. In such apparatus, process gases are commonly introduced into a deposition chamber from a gas manifold disposed upstream of a substrate. As the process gases are drawn across the surface of the substrate, they are disassociated and recombined under the influence of an electromagnetic field developed by a deposition cathode or microwave generator. By providing a precathode system upstream of the deposition cathode or microwave generator, (1) impurities in the process gases, (2) contaminants from the walls of the deposition chamber and (3) initially disassociated and recombined process gas compositions may be deposited onto and collected from a collection plate disposed upstream of the substrate. In this manner, the process gases subjected to the upstream electromagnetic field are more easily broken down by the deposition cathode and deposited onto the substrate in desired chemical combinations and compositions so as to provide improved electrical, chemical and optical properties. Also disclosed herein is the use of such a precathode assembly to aid in the high speed deposition of homogeneous, amorphous, powder-free semiconductor material of uniform thickness across the entire width of the substrate.

12 Claims, 13 Drawing Figures

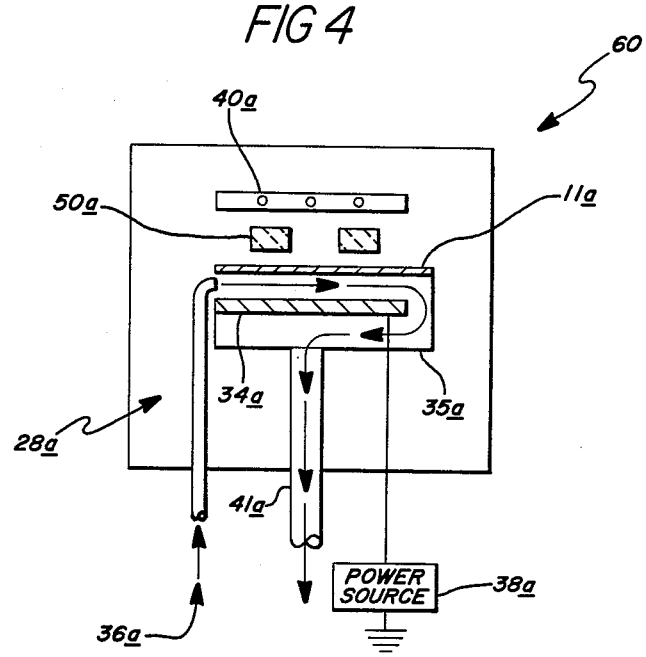
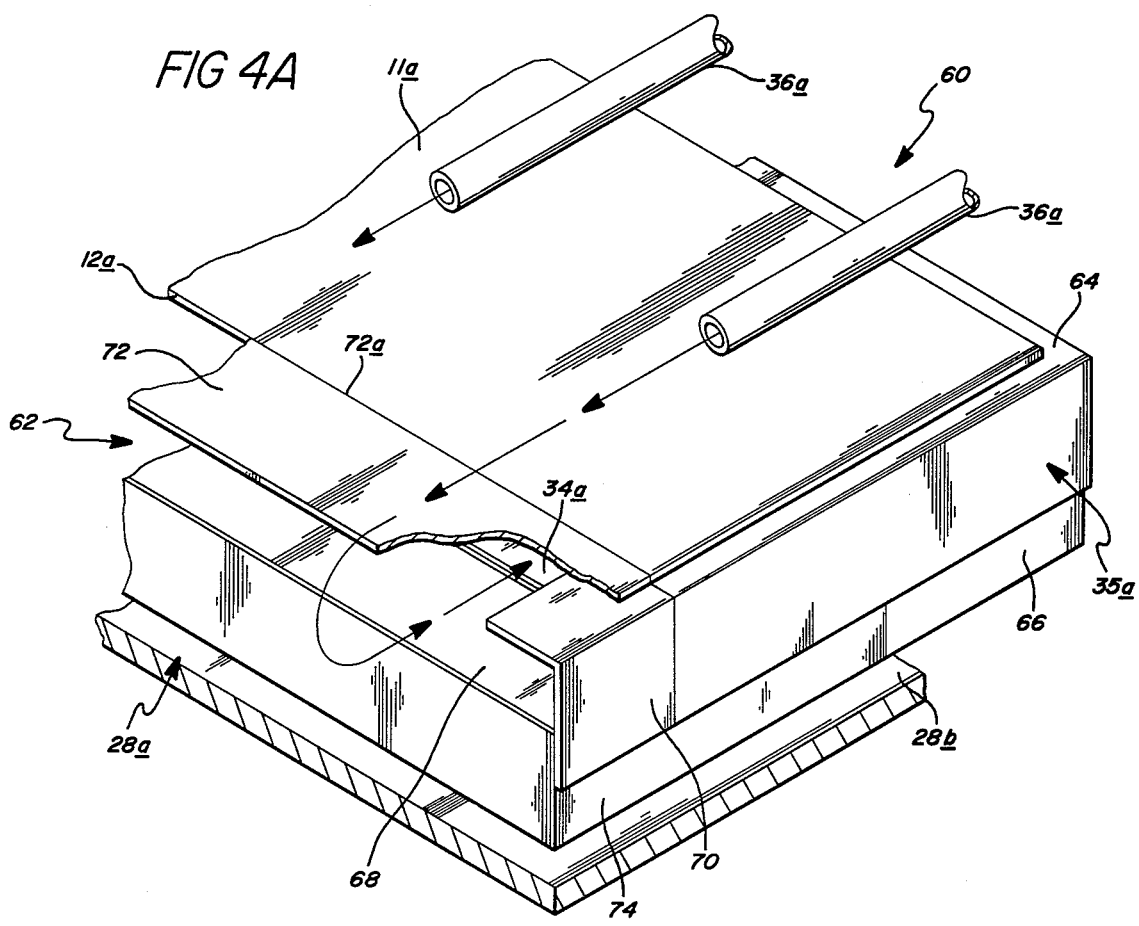

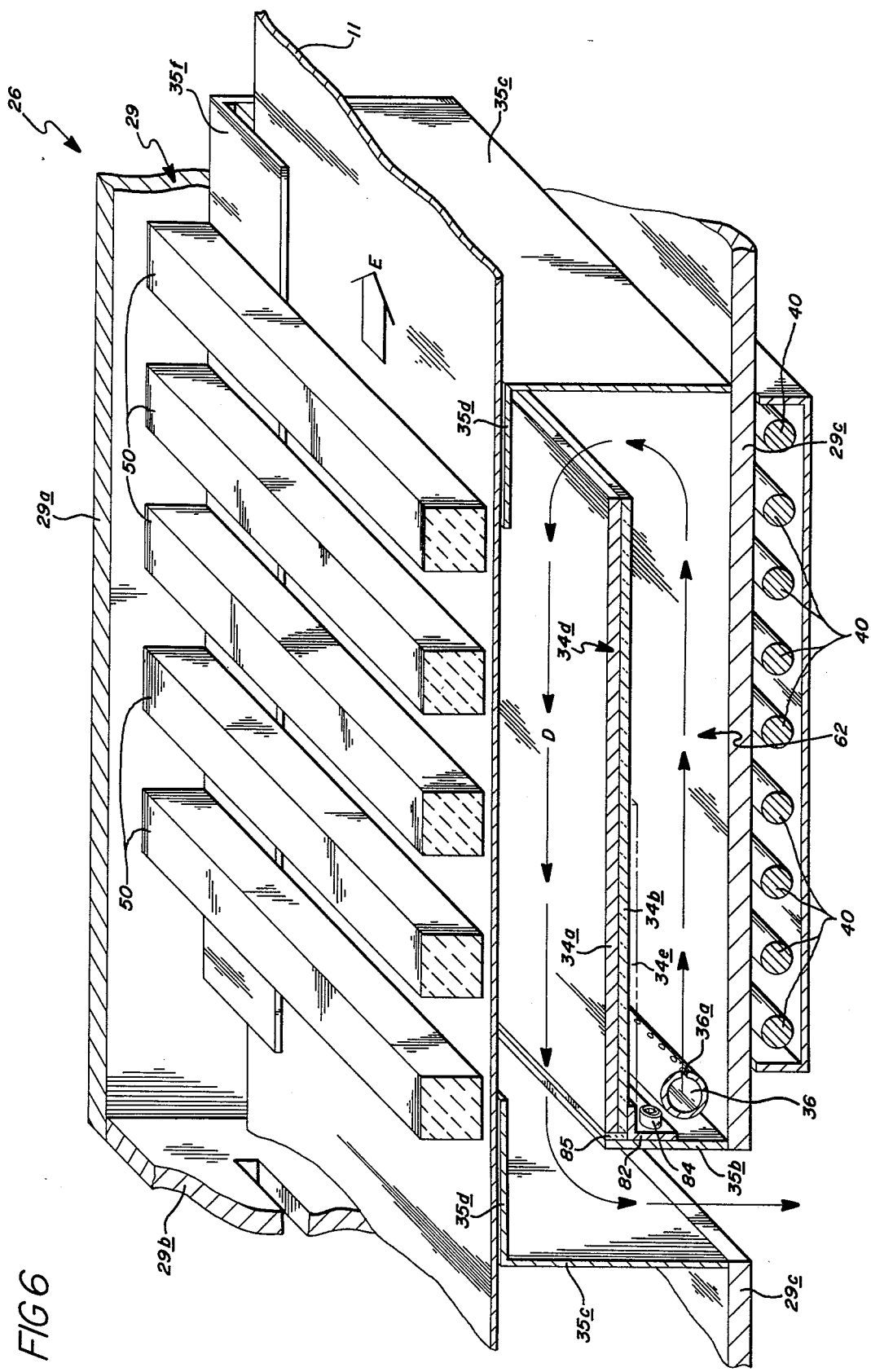

UPSTREAM CATHODE ASSEMBLY

CROSS REFERENCE TO RELATED APPLICATIONS

This patent application is a continuation-in-part of U.S. patent application Ser. No. 452,224 of Prem Nath and Masatsugu Izu filed Dec. 22, 1982 and entitled UPSTREAM CATHODE ASSEMBLY.

FIELD OF THE INVENTION

This invention relates generally to apparatus for producing improved semiconductor material either by continuous or batch processing techniques, and more particularly to an upstream cathode system for (1) collecting impurities and contaminants, and (2) initiating the plasma forming and depositing process, whereby a semiconductor film of substantially homogeneous and uniform composition is deposited across the surface of a substrate. Also described is a method which employs the upstream cathode assembly of the instant invention to deposit stable, high quality, powder-free semiconductor material of uniform thickness at speeds as high as 30 angstroms per second.

BACKGROUND OF THE INVENTION

This invention relates to apparatus for either (1) continuously producing photovoltaic devices on a substrate by depositing successive semiconductor layers in each of at least two adjacent deposition chambers through which the substrate continually travels, or (2) utilizing batch processing techniques to produce photovoltaic devices by depositing successive semiconductor layers in each of at least two unconnected deposition chambers into which the substrate is successively transported. Since the composition of the semiconductor layers is dependent upon the particular process gases introduced into each of the deposition chambers, even small amounts of impurities or contaminants in the semiconductor layers deleteriously effect the efficiencies of photovoltaic devices produced. Therefore, process gases introduced into the deposition chamber itself, must be carefully controlled. To that end, the deposition chamber is sealed to the atmosphere, pumped to low pressures, heated to high temperatures and flushed with a gas such as hydrogen or argon prior to initiation of the glow discharge deposition process.

In glow discharge deposition techniques currently employed, the process gases are introduced at spaced intervals along one of the sides of the deposition cathode. The process gases are drawn by a vacuum pump across the deposition surface of a substrate where an r.f. powered cathode or a microwave generator creates an electromagnetic field in the region defined between that deposition cathode or microwave generator and the substrate (hereinafter referred to as the "plasma region" or "deposition region"). The process gases, upon entering the electromagnetic field are disassociated into an ionized plasma which is adapted to be deposited onto the exposed surface of the substrate.

However, it has now been determined that the semiconductor material produced adjacent the upstream section of the substrate, that section of the substrate first contacted as the process gases flow across the deposition surface thereof, exhibits electrically inferior characteristics as compared to the semiconductor material deposited onto the downstream deposition surface of the substrate. The electrically inferior characteristics of the upstream semiconductor material can be attributed, inter alia, to (1) impurities in the process gases intially entering the plasma region of the deposition chamber and more quickly depositing onto the substrate in that chamber, than the desired process gas species, (2) contamination from the ambient conditions existing in said deposition chamber when the process gases first contact the energized electromagnetic field and also more quickly depositing onto the substrate in that chamber than the desired process gas species, and (3) the changing chemical combinations and bonding formations which are formed as the process gases move across and are subjected to the electromagnetic field in each deposition chamber.

More particularly, despite efforts to procure "pure" process gases, at least trace amounts of impurities are present. In prior glow discharge deposition apparatus, these impurities were deposited as the process gases contacted the electromagnetic field at the upstream side of the substrate. Further, despite pumping and cleansing efforts, contaminants would outgas from the walls of the deposition chamber when the deposition cathode or microwave generator was powered to create the electromagnetic field. These impurities and contaminants would be deposited on the upstream side of the substrate, thereby contributing to the electrically, chemically and optically inferior upstream semiconductor material.

It has also been found that the composition of the semiconductor film deposited onto the substrate in such prior deposition apparatus varies with the length of time the process gases are subjected to the effects of the electromagnetic field. In other words, the species and compounds formed when the process gases initially come into contact with and are disassociated by the electromagnetic field vary from the species and compounds deposited onto the substrate at a more downstream location. Although, the precise physical and chemical properties of the species and compounds deposited at the downstream location are currently being investigated and have not as yet been fully identified, it is apparent that they provide superior electrical and optical responses (as compared to the responses of the material deposited at the upstream location).

Whether those improved electrical and optical responses are due to the removal of trace impurities from the process gases, the removal of contaminants outgassed from the walls of the deposition chamber, the formation and breakdown of species and compounds, or a combination of all of the foregoing, it is clear that the properties exhibited by the material deposited onto the substrate is dependent on the length of time the precursor process gases spent in the presence of an electromagnetic field. In other words, the overall electrical, chemical and optical properties of semiconductor devices produced from semiconductor layers deposited onto a substrate are superior at the downstream segment of the substrate.

Accordingly, it is one principle object of the upstream cathode system of the present invention to create an electromagnetic field upstream of the deposition cathode or microwave generator for (1) collecting impurities from the process gases and contaminants from the walls of the deposition chamber and/or (2) subjecting the process gases to a predeposition electromagnetic field prior to their introduction to the deposition electromagnetic field. In this manner, an improved, stable semiconductor film is deposited onto the substrate, said film being of substantially uniform and homogeneous composition across the surface of the substrate and exhibiting improved photovoltaic characteristics.

A second problem encountered by Applicants in the fabrication of amorphous semiconductor material by glow discharge plasma deposition was a limitation imposed on the speed of deposition. Initial deposition rates were limited to approximately 4 to 5 angstroms per second in order to produce material of acceptable quality. In view of the fact that for the mass production of semiconductor material, higher deposition rates would be necessary, Applicants attempted to deposit the amorphous semiconductor material at a rate of 10 to 12 angstroms per second by increasing the power and/or changing the ratios of the precursor reaction gases such as silane and molecular hydrogen. The disappointing results consisted of (1) the formation of powder in the deposited amorphous semiconductor material, and (2) a significant disparity in the thickness of said deposited amorphous semiconductor material at the gas inlet side (upstream side) as compared to the gas outlet side (downstream side) of the substrate. More particularly, in a continuous deposition apparatus, such as the machine schematically illustrated in FIG. 2, if the amorphous semiconductor material is deposited at a rate of approximately 10 to 12 angstroms per second by increasing the r.f. power utilized to disassociate a two part silane to one part hydrogen gas mixture, an approximately 3500 angstrom thick layer is deposited at the gas inlet side of the substrate as compared to an approximately 6500 angstrom thick layer which is deposited at the gas outlet side thereof.

That which follows is a synopsis of (1) the detailed investigation of the problems of instability, thickness variation and powder formation which occurred at high deposition rates, and (2) the manner in which the upstream cathode assembly of the present invention, briefly discussed hereinbefore, was employed to solve said problem. It will be helpful in understanding the problem and the solution thereof to refer to FIGS. 7-9.

Referring now to FIG. 7, a schematic illustration of the glow discharge plasma deposition region of a deposition chamber is depicted. Basically, precursor reaction gases, such as a one to two ratio of silane and atomic hydrogen, are introduced from the gas manifold to flow around the upstream side of the cathode before entering the deposition plasma region for disassociation and deposition onto the substrate. Spent reaction gases and nodeposited plasma flow around the downstream side of the cathode and are withdrawn from the deposition plasma region through the exit port.

By employing the apparatus schematically represented in FIG. 7, Applicants discovered that powder formation could be eliminated by either (1) increasing the flow rate (volume per unit time) of the reaction gases entering the deposition plasma region, while maintaining the ratio of reaction gas constituents (such as the ratio of silane to molecular hydrogen) substantially constant, or (2) modifying the design of the deposition plasma region so that the cathode to substrate distance "d" is greater than the distance from the wall of the shielding to the edge of the cathode "r" so that gas stagnation does not occur. However, when the thickness of the deposited semiconductor layer was measured, the layer was repeatedly found to be as much as 40-50 percent thinner at the gas inlet side of the substrate than at the gas outlet side thereof. This is shown in FIG. 8 which depicts the thickness of the semiconductor material deposited at the inlet side ($t_1$) as being typically about 3500 angstroms and the thickness of the semiconductor material deposited at the outlet side ($t_2$) as being typically 6500 angstroms thick.

Turning now to FIG. 9, a schematic representation of the glow discharge deposition plasma region of a deposition chamber, similar to the representation of FIG. 7, illustrates the manner in which Applicants next attempted to solve the problems of stability, thickness, uniformity and powder free deposition. Previously, the substrate to cathode distance "d" was maintained constant along the entire length of the deposition plasma region. With that in mind, it was hypothesized that with all other parameters remaining constant, by moving the substrate closer to the cathode, the effects of the electromagnetic field developed therebetween would be intensified and the deposition rate of amorphous semiconductor material adjacent the more closely spaced substrate-cathode regions would increase. Accordingly, Applicants attempted to increase the thickness $t_1$, at the gas inlet side of the substrate relative to the thickness $t_2$ at the gas outlet side thereof by angling the substrate relative to the cathode in the manner noted by the substrate $S_1$, shown in phantom outline in FIG. 9. However, it was found that rather than increasing the thickness $t_1$ of the deposited semiconductor material at the gas inlet side of the substrate, the decrease in substrate to cathode distance resulted in a further *decrease* in thickness of that deposited material. This was attributed to the "nozzle effect" which the angled substrate produced, said nozzle effect serving to increase the velocity of the reaction gases flowing through the deposition plasma region.

Applicants, while still attempting to solve the aforementioned problems, next decided to increase the substrate to cathode distance in the manner depicted by the substrate $S_2$ again shown in phantom outline FIG. 9, i.e. by increasing the substrate to cathode distance at the gas inlet side thereof. It was theorized that this design would cause the reaction gases to stagnate adjacent the upstream side of the substrate, by forming a greater upstream substrate to cathode distance than downstream substrate to cathode distance, the thickness ($t_1$) of deposited semiconductor material at the upstream side of the substrate would increase. While the thickness of the deposited material at the upstream side did increase, and despite Applicants' attempts to vary the degree of angulation of the substrate relative to the cathode, the thickness of the deposited material at the gas inlet side of the substrate could only be increased to a value of approximately 65 percent of the thickness at the gas outlet side.

The foregoing experimental results led Applicants to the conclusion that the reactivity of the reaction gas mixtures travelling through the deposition plasma region was changing as that mixture progressed through said region due to the length of time it was subjected to the effects of the electromagnetic field. It was therefore hypothesized that the reactivity of the reaction gas mixtures at the upstream side of the cathode is much different than the reactivity of the mixtures as the downstream side. This conclusion conforms with other of Applicants' experimental results, mentioned hereinabove, which demonstrate the quality (the optical, electrical and chemical properties) of the amorphous semiconductor material deposited at the upstream side of the cathode is inferior to the quality of the material deposited at the downstream side.

FIG. 10 schematically illustrates the final design of the novel cathode assembly of the present invention which Applicants originated to help to provide a stable, powder-free and uniform thickness of amorphous semiconductor material across the entire length of the substrate. More specifically, the design utilized the concept of flowing the reaction gas mixtures through a predeposition electromagnetic field to begin the disassociation and species recombination thereof. Thus, by the time the now ionized plasma reached the deposition plasma region, the reactivity of the species contained therein was more homogeneous and a powder-free, uniform deposition of semiconductor resulted. Of course, it was necessary to provide a nondepletable supply of process gases and prevent stagnation of those gases as they travelled about the cathode in order for the cathode assembly of the present invention, illustrated in FIG. 10, to achieve said powder-free, uniform deposition.

Applicants have thus solved the powder formation and thickness uniformity problems by utilizing (1) the predeposition technology described supra, to design a special glow discharge deposition plasma region which includes an elongated upstream cathode for subjecting the process gases to a predeposition electromagnetic field prior to introducing those process gases, albeit in ionized form, into the deposition plasma region; (2) the experimental results, described supra, to provide a sufficient flow rate of reaction gas mixtures so as to prevent depletion of those mixtures as they travel through the plasma region; and (3) the experimental results, also described supra, to provide a path of travel for the reaction gas mixtures of sufficient cross-sectional area so as to prevent nonuniform stagnation and compression of those mixtures travelling through the predeposition plasma and deposition plasma regions. The result is a high speed deposition system in which a stable, uniform layer (uniform in electrical, chemical and optical characteristics) of powder-free amorphous semiconductor material can be deposited.

Recently, considerable efforts have been made to develop systems for depositing amorphous semiconductor alloys, each of which encompass relatively large areas and which can be doped to form p-type and n-type materials for the production of p-i-n type devices which are, in operation, substantially equivalent to their crystalline counterparts.

It is now possible to prepare amorphous semiconductor alloys by glow discharge deposition techniques that have (1) acceptable concentrations of localized states in the energy gaps thereof, and (2) provide high quality electronic properties. One such technique is fully described in U.S. Pat. No. 4,226,898, Amorphous Semiconductors Equivalent to Crystalline Semiconductors, Stanford R. Ovshinsky and Arun Madan which issued Oct. 7, 1980 and by vapor deposition as fully described in U.S. Pat. No. 4,217,374, Stanford R. Ovshinsky and Masatsugu Izu, which issued on Aug. 12, 1980, under the same title. As disclosed in these patents, it is believed that fluorine introduced into the amorphous silicon semiconductor operates to substantially reduce the density of the localized states in the band gaps thereof and facilitates the addition of other alloying materials, such as germanium.

The concept of utilizing multiple cells, to enhance photovoltaic device efficiency, was discussed at least as early as 1955 by E. D. Jackson, U.S. Pat. No. 2,949,498 issued Aug. 16, 1960. The multiple cell structure therein discussed utilized p-n junction crystalline semiconductor devices. Essentially the concept is directed to utilizing different band gap devices to more efficiently collect various portions of the solar spectrum and to increase open circuit voltage ($V_{oc}$). The tandem cell device has two or more cells with the light directed serially through each cell, with a large band gap material followed by smaller band gap materials to absorb the light passed through the first cell. By substantially matching the generated currents from each cell, the overall open circuit voltage may be added, thereby making the greatest use of light energy passing through the cells.

It is of obvious commercial importance to be able to mass produce photovoltaic devices by a continuous process. Unlike crystalline semiconductor materials which are limited to batch processing for the manufacture of solar cells, amorphous semiconductor alloys can be deposited in multiple layers over large area substrates to form solar cells in a high volume, continuous processing system. Continuous processing systems of this kind are disclosed, for example, in U.S. Pat. No. 4,400,409, filed May 19, 1980 for A Method of Making P-Doped Silicon Films and Devices Made Therefrom; and U.S. patent applications: Ser. No. 240,493, filed Mar. 16, 1981 for Continuous Systems For Depositing Amorphous Semiconductor Materials; Ser. No. 306,146, filed Sept. 28, 1981 for Multiple Chamber Deposition and Isolation System and Method; and Ser. No. 359,825, filed Mar. 19, 1982 for Method and Apparatus For Continuously Producing Tandem Amorphous Photovoltaic Cells. As disclosed in this latter patent application, a substrate may be continuously advanced through a succession of deposition chambers, wherein each chamber is dedicated to the deposition of a specific semiconductor material. In making a solar cell of a p-i-n type configuration, the first chamber is dedicated for depositing a p-type semiconductor layer, the second chamber is dedicated for depositing an intrinsic semiconductor layer and the third chamber is dedicated for depositing an n-type semiconductor layer.

Whereas, for purposes of mass production, the succession of deposition chambers described hereinabove, is most advantageously employed, a batch processing system may also be used. In such a batch processing system the amorphous semiconductor alloy material can also be deposited in multiple layers over large area substrates to form photovoltaic devices. Batch processing techniques for producing p-i-n type solar cells may proceed in either of two possible manners: (1) a plurality of interlocked deposition chambers are provided wherein a first chamber deposits a p-type semiconductor layer; a second chamber deposits an intrinsic semiconductor layer; and a third chamber deposits an n-type semiconductor layer; or (2) a single deposition chamber is provided which is flushed after the deposition of each p, i, n semiconductor layer. In either case, the batch process techniques are accomplished on individual substrate plates in an intermittent mode of operation.

While both systems, batch and continuous, have their own set of operating problems, they both must be kept free of contaminants, which, if deposited with the semiconductor material onto the deposition surface of the substrate, would harm if not destroy the efficiency and operation of photovoltaic devices produced therefrom. Accordingly, each system must be careful to control the interior environment of its deposition chamber to prevent the influx of contaminants from external sources. After being exposed to the environment, the chambers are pumped, heated and cleansed in an attempt to remove contaminants such as water vapor from the chamber walls. Further, only the purest process gases are purchased for introduction into the chamber and subsequent deposition onto the substrate surface as semiconductor layers. And finally, both systems produce said semiconductor layers by employing very similar operating parameters such as r.f. or microwave power, pressure, process gas mixture, flow rate, temperature, etc.

It should therefore be obvious to those ordinarily skilled in the art that the upstream cathoe system of the present invention is equally well-suited for use with batch processing and continuous production apparatus. With both sets of apparatus, it serves the identical function of creating an electromagnetic field upstream of the deposition cathode for (1) collecting impurities from the process gases and contaminants from the walls of the deposition chambers, and (2) initiating the disassociation of process gases into electrically, chemically and optically superior species which, when deposited onto the substrate, are of substantially homogeneous chemical composition.

It should further be apparent that the upstream cathode assembly, described herein, has great utility in not only (1) increasing the quality and stability of semiconductor material, but also in (2) increasing the rate of deposition of that semiconductor material without inducing powder formation, and (3) while maintaining a constant thickness of that material across the entire surface of the substrate.

These and other objects and advantages of the present invention will become clear from the drawings, the claims and the description of the invention which follow.

BRIEF SUMMARY OF THE INVENTION

Disclosed herein is an upstream cathoe system adapted for use with either batch-type or continuous-type glow discharge deposition apparatus in which a semiconductor film is deposited onto the exposed surface of a large area substrate in a glow discharge deposition chamber. In such apparatus, process gases introduced into the deposition chamber are directed to flow through the deposition plasma region thereof. The power source is adapted to develop an electromagnetic field for disassociating and recombining the process gases into ionized species and depositing the semiconductor film onto the exposed substrate surface. The upstream cathode system of the present invention is preferably disposed upstream of the deposition cathode or microwave generator for forming an upstream electromagnetic field in the presence of which impurities from the process gases and contaminants from the walls of the deposition chamber are removed and collected, and the process gases begin their disassociation and recombination into species. In this manner, an improved semiconductor film of substantially uniform and homogeneous composition is deposited onto the exposed surface of the substrate in the presence of the downstream electromagnetic field, said film being free of process gas impurities and chamber wall contaminants and having been disassociated and recombined into ionized species of substantially similar reactivity, which, when deposited, exhibit improved electrical, chemical and optical properties.

The upstream cathode system includes (1) an r.f. powered pre-cathode which may be an extension of the deposition cathode or the back surface of the deposition cathode past which the process gases flow prior to contacting the deposition plasma region, and (2) a collection plate disposed adjacent to, but spaced from, the extension or pre-cathode, whereby the system is adapted to develop an upstream electromagnetic field or predeposition plasma region. It is in the presence of this upstream electromagnetic field that impurities from the process gases, contaminants from the chamber walls, and partially disassociated and recombined species collect on a surface of the collection plate.

In the embodiment wherein the upstream cathode system of the present invention is used with a continuously moving substrate, the process gases may either be introduced to flow in a direction transverse to the direction of movement of the substrate, or in the same direction as the direction of substrate movement through the deposition chamber. In either case, the precathode and collection plate are substantially equal in length to the width on the substrate. However, when the process gases flow transversely across the substrate (in a direction transverse to direction of substrate movement through the deposition chamber), the collection plate and the precathode are substantially equal in length to the length of the deposition cathode and operatively disposed adjacent thereto.

There is also disclosed herein a method for the high speed disposition of stable, amorphous semiconductor material in deposition apparatus which includes a substrate, a supply of precursor reaction materials, a deposition plasma region located downstream of the supply of reaction materials, reaction material decomposing means, and an exhaust pump for removing nondeposited reaction materials. The method includes the steps of: (1) subjecting the reaction materials to the effects of a decomposition initiating region for beginning the decomposition process at a location upstream of the decomposition and deposition region, (2) introducing a sufficient volume per unit time of reaction materials to prevent depletion thereof before the reaction materials flow completely through the decomposition and deposition region, and (3) preventing nonuniform stagnation and compression of the reaction materials flowing through the decomposition and deposition region, whereby the deposition apparatus provides for the high speed deposition of a uniform layer of stable, powder-free semiconductor material.

BRIEF DESCRIPTION OF THE DRAWINGS

FIG. 4 is a diagrammatic representation of a deposition chamber adapted for use in the batch production of photovoltaic devices, such as the cells shown in FIG. 1;

FIG. 4A is an enlarged, fragmentary perspective view of the upstream cathode system shown in FIG. 3 and illustrating the disposition of said system relative to the deposition cathode, the substrate and the process gas source in batch-type glow discharge deposition apparatus;

Figure 5:
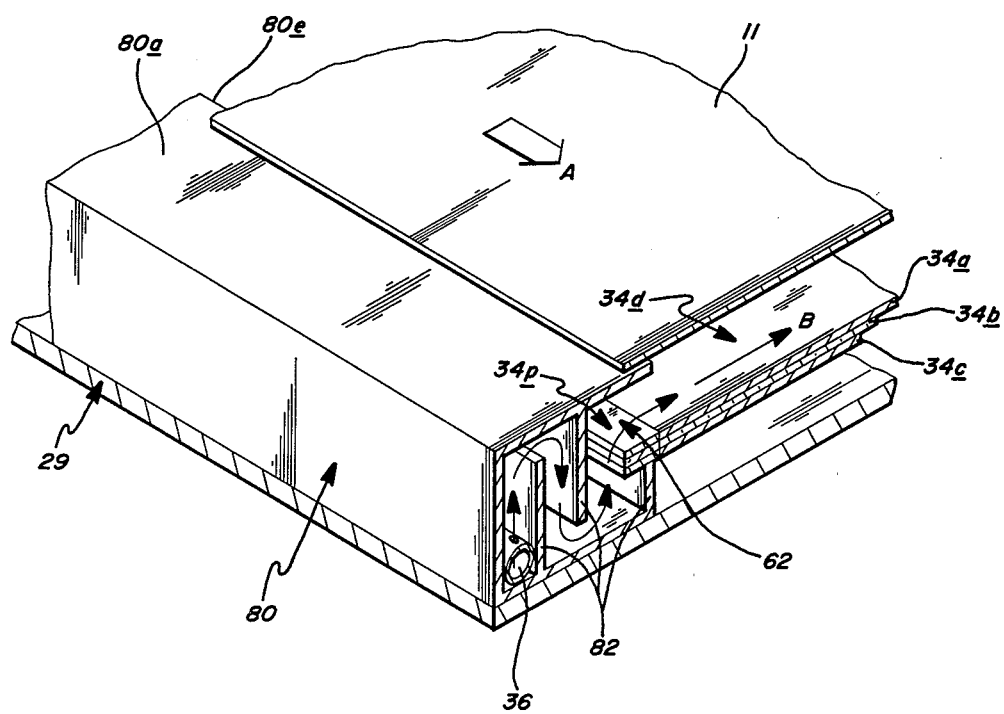
Figure 6A:
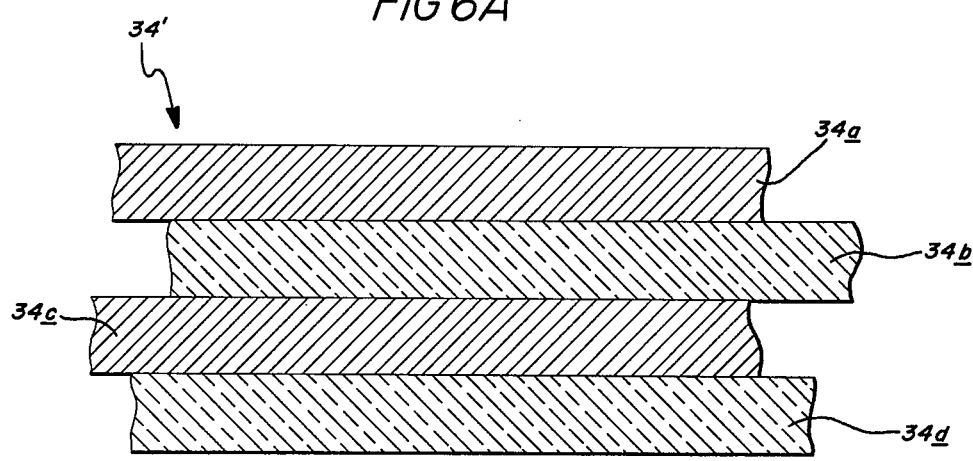
Figure 6B:
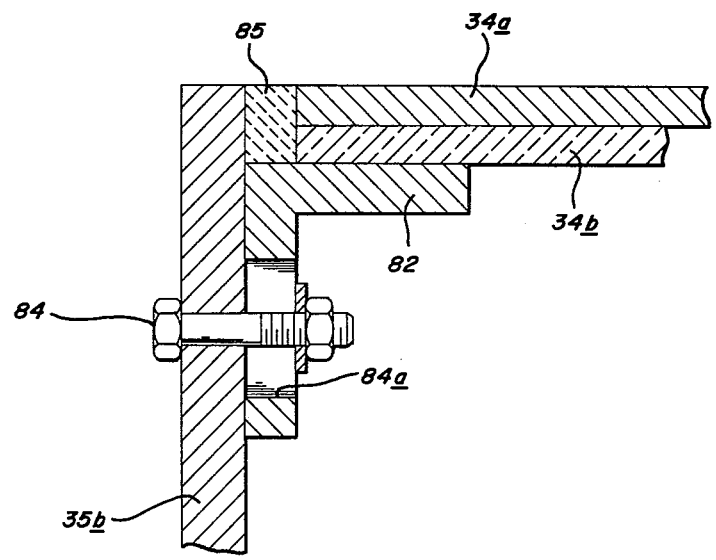
Figure 7:
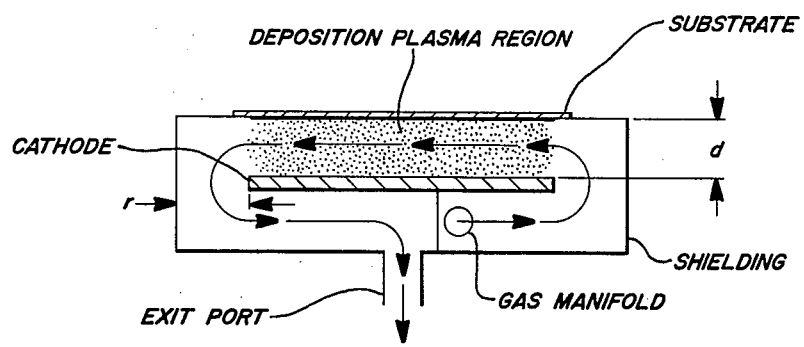
Figure 8:
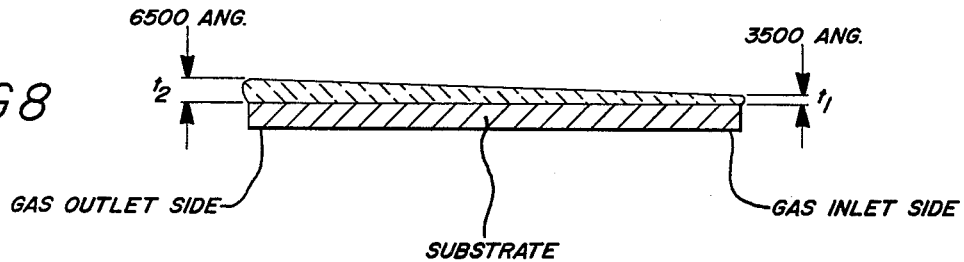
Figure 9:
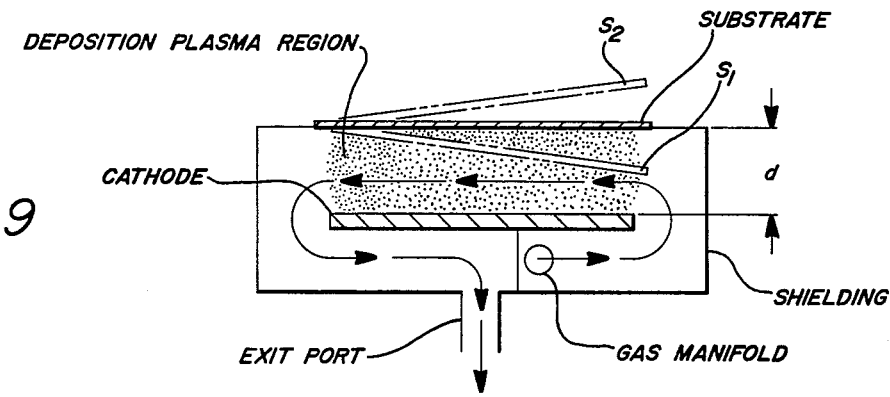
Figure 10:
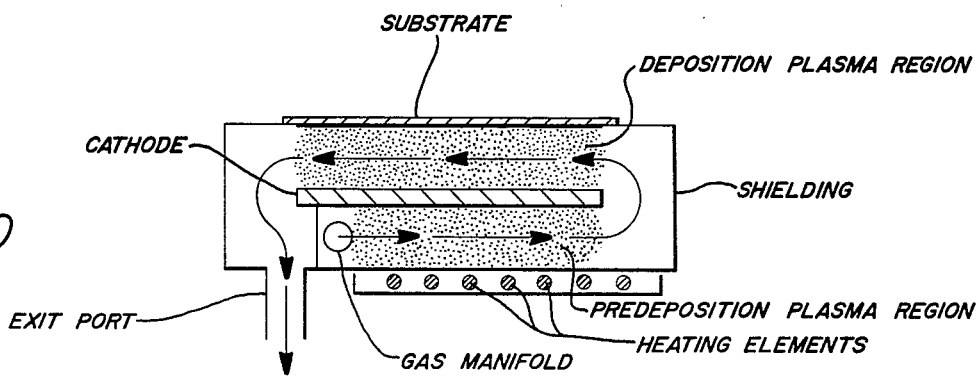

FIG. 5 is an enlarged, fragmentary perspective view of one embodiment of the upstream cathode system of the present invention as modified for operative disposition adjacent the deposition cathode, the substrate and the process gas inlet in a continuous glow discharge deposition apparatus wherein the direction of process gas flow is transverse to the direction of substrate movement;

FIG. 6 is an enlarged, fragmentary perspective view of an upstream cathode system of the present invention as operatively disposed in a continuous glow discharge deposition apparatus, wherein the direction of process gas flow parallels the direction of substrate movement;

FIG. 6A is an enlarged, cross-sectional view depicting the multi-layered embodiment of the cathode sandwich of the present invention;

FIG. 6B is an enlarged, fragmentary cross-sectional view of the electrically insulating bracket upon which the cathode plate, shown in FIG. 6, of the present invention is supported;

FIG. 7 is a diagrammatic representation of the cathode assembly of Applicants' glow discharge deposition system prior to the instant invention;

FIG. 8 is a cross-sectional view of the substrate illustrated in FIG. 7 depicting the non-uniform thickness of semiconductor material which is deposited during high speed deposition;

FIG. 9 is a diagrammatic representation, in cross-section, of the cathode assembly which Applicants employed in their glow discharge deposition system in an attempt to deposit layers of semiconductor material of uniform thickness; and FIG. 10 is a diagrammatic representation of the novel cathode assembly, in cross-section, of the present invention, including an upstream cathode region, which Applicants designed to provide uniform, high-speed deposition of stable, powder-free semiconductor material.

DETAILED DESCRIPTION OF THE DRAWINGS

I

The Photovoltaic Cell

Figure 1:
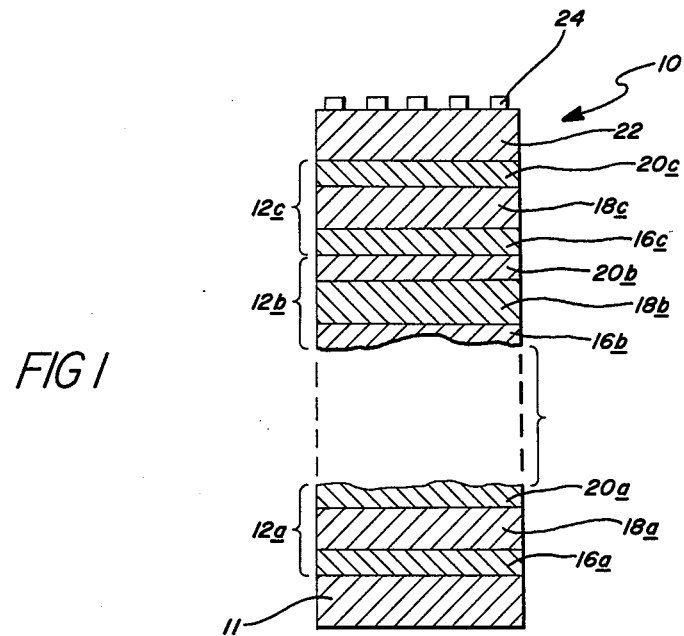
FIG. 1 is a fragmentary, cross-sectional view of a tandem photovoltaic device comprising a plurality of p-i-n type cells, each layer of the cells formed from a semiconductor alloy.

Referring now to the drawings and particularly to FIG. 1, a photovoltaic cell, formed of a plurality of successive p-i-n layers, each of which includes, preferably, an amorphous semiconductor alloy, is shown generally by the numeral 10. It is for the production of this type of photovoltaic device, wherein amorphous semiconductor layers are continuously deposited onto a substrate in isolated deposition chambers, that the upstream deposition apparatus of the present invention was developed.

More particularly, FIG. 1 shows a p-i-n type photovoltaic device such as a solar cell made up of individual p-i-n type cells 12a, 12b and 12c. Below the lowermost cell 12a is a substrate 11 which may be transparent or formed from a metallic material such as stainless steel, aluminum, tantalum, molybdenum or chrome. Although certain applications may require a thin oxide layer and/or a series of base contacts prior to application of the amorphous material, for purposes of this application, the term "substrate" shall include not only a flexible film, but also any elements added thereto by preliminary processing. Also included within the scope of the present invention are substrates formed of glass or a glass-like material on which an electrically conductive electrode is applied.

Each of the cells 12a, 12b and 12c are preferably fabricated with an amorphous semiconductor body containing at least a silicon alloy. Each of the semiconductor bodies includes an n-type conductivity layer 20a, 20b and 20c; a substantially intrinsic layer 18a, 18b and 18c; and a p-type conductivity layer 16a, 16b and 16c. As illustrated, cell 12b is an intermediate cell and, as indicated in FIG. 1, additional intermediate cells may be stacked atop the illustrated cells without departing from the spirit or scope of the present invention. Also, although p-i-n cells are illustrated, the upstream cathode assembly of this invention may also be used with apparatus adapted to produce single or multiple n-i-p cells.

It is to be understood that following the deposition of the semiconductor alloy layers, a further deposition process may be either performed in a separate environment or as a part of a continuous process. In this step, a TCO (transparent conductive oxide) layer 22 is added. An electrode grid 24 may be added to the device where the cell is of a sufficiently large area, or if the conductivity of the TCO layer 22 is insufficient. The grid 24 shortens the carrier path and increases the conduction efficiency.

II

The Multiple Glow Discharge Deposition Chambers

Figure 2:
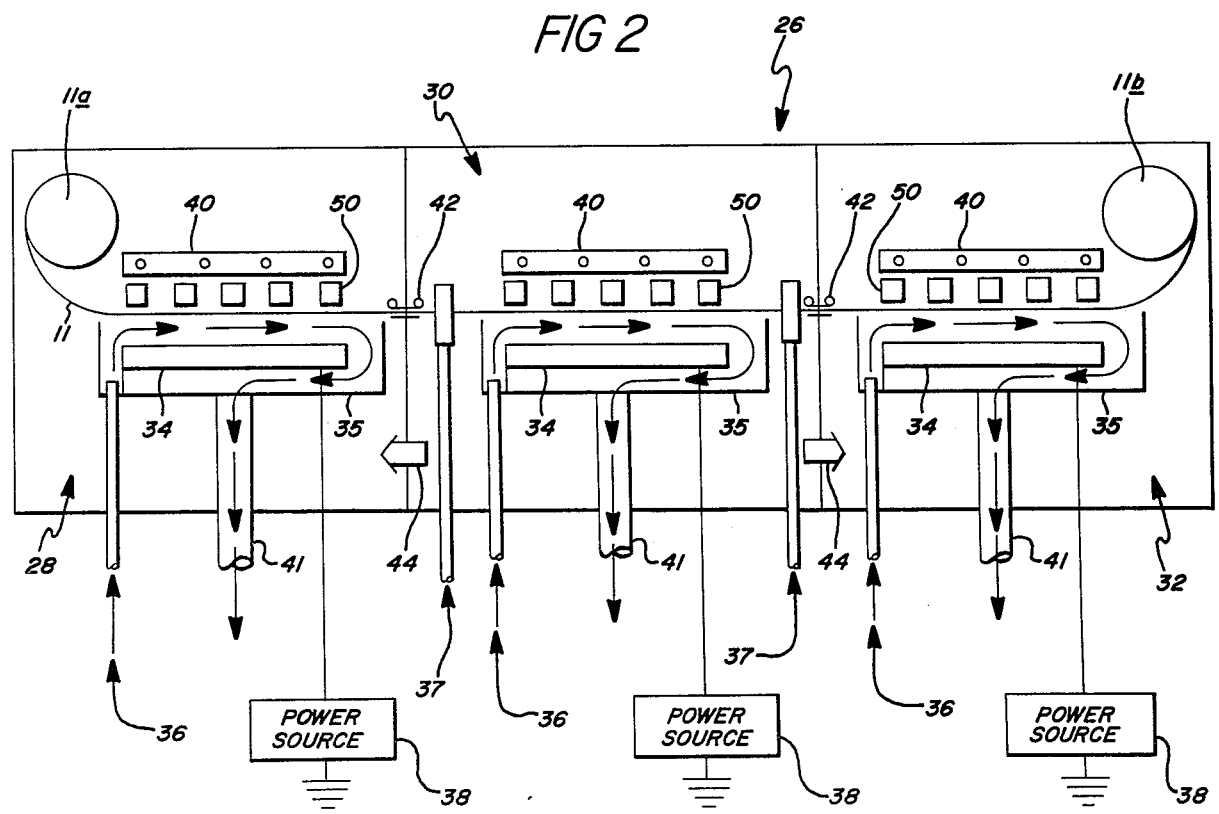
FIG. 2 is a diagrammatic representation of a multiple glow discharge chamber deposition system adapted for use in the continuous production of photovoltaic devices such as the cells shown in FIG. 1.

Turning now to FIG. 2, a diagrammatic representation of multiple glow discharge chamber deposition apparatus for the continuous production of semiconductor cells is generally illustrated by the reference numeral 26. The apparatus 26 includes a plurality of isolated, dedicated deposition chambers, each chamber of which is interconnected by a gas gate through which sweep gases, and a web of substrate material are adapted to pass.

The apparatus 26 is adapted to mass produce large area, amorphous semiconductor layers of p-i-n configuration onto the deposition surface of a substrate 11 which is continually fed therethrough. To deposit the semiconductor layers required for producing multiple p-i-n type cells, the apparatus 26 includes at least one triad of deposition chambers. Each of the at least one triad of deposition chambers comprises: a first deposition chamber 28 in which a p-type conductivity amorphous semiconductor layer is deposited onto the deposition surface of the substrate 11 as the substrate 11 passes therethrough; a second deposition chamber 30 in which a substantially intrinsic semiconductor layer is deposited atop the p-type layer on the deposition surface of the substrate 11 as the substrate 11 passes therethrough; and a third deposition chamber 32 in which an n-type semiconductor layer is deposited atop the intrinsic layer on the deposition surface of the substrate 11 as the substrate 11 passes therethrough. It should be apparent that (1) although, only one triad of deposition chambers has been illustrated, additional triads or additional individual chambers may be added to the apparatus to provide the machine with the capability of producing photovoltaic cells having any number of amorphous p-i-n type semiconductor layers; (2) the upstream cathode system of the present invention is equally applicable to batch-type production apparatus wherein an isolated chamber includes the necessary elements to deposit a semiconductor layer by glow discharge techniques; (3) the substrate supply core 11a and the substrate take-up core 11b are shown in the deposition chambers for illustrative purposes only, while in reality the cores would be housed in separate chambers operatively connected to the deposition chambers; (4) although the glow discharge techniques illustrated herein employ cathodes energized by r.f. power, other glow discharge energization techniques such as microwave frequency, may be employed without departing from the spirit of the present invention; and (5) the cathodes of the upstream cathode systems of the present invention, although depicted as horizontally disposed, may enjoy any angular orientation, such as vertical.

Each deposition chamber 28, 30 and 32 of the triad is adapted to deposit a single, preferably amorphous, semiconductor layer, by glow discharge deposition, onto the electrically conductive substrate 11. To that end, each of the deposition chambers 28, 30 and 32 includes: a cathode 34; a shield 35 disposed about each of the cathodes 34; a process gas supply conduit 36; a radio frequency generator 38; a process gas and plasma evacuation conduit 41; a plurality of transversely extending magnetic elements 50; a plurality of radiant heating elements shown schematically as 40 in FIG. 2; and a gas gate 42 operatively interconnecting the intrinsic deposition chamber to each of the dopant chambers. Additionally, an inert sweep gas conduit 37 is disposed on opposed sides of the intrinsic deposition chamber.

The supply conduits 36 are operatively associated with the respective cathodes 34 to deliver process gas mixtures (also referred to herein as reaction gas mixtures) to the plasma regions which are created in each deposition chamber between said cathodes 34 and the substrate 11. The cathode shields 35 are adapted to operate in conjunction with the web of substrate material 11 and the evacuation conduit 41 to substantially confine the plasma within the cathode region of the deposition chambers.

The radio frequency or microwave generators 38 operate in conjunction with the cathodes 34, the radiant heaters 40 and the grounded substrate 11 to form the plasma by disassociating and recombining the elemental reaction gases entering the deposition chambers into ionized deposition species. The deposition species are then deposited onto the bottom surface of the substrate 11 as amorphous semiconductor layers. The substrate 11 is maintained substantially flat by the plurality of rows of magnetic elements 50 which provide an attractive force urging the substrate upwardly, out of its normal sagging path of travel.

With reference to FIG. 4, apparatus for the batch-type production of photovoltaic cells in a glow discharge deposition chamber is generally illustrated by the reference numeral 60. The apparatus 60, like the apparatus 26 described hereinabove, is adapted to deposit large area amorphous semiconductor layers of p-i-n type configuration onto the surface of a substrate 11a which is stationarily mounted in the deposition chamber 28a. In the deposition chamber 28a a p-type conductivity layer is deposited onto the surface of the substrate 11a after the substrate is transported thereinto; the chamber 28a is then flushed and a substantially intrinsic semiconductor layer is deposited atop the p-type layer; the chamber 28a is again flushed and an n-type semiconductor layer is deposited atop the intrinsic layer.

In order to deposit a single amorphous semiconductor layer, by glow discharge deposition, onto the electrically conductive substrate 11a, the deposition chamber 28a includes: a cathode 34a, a shield 35a, a process gas supply conduit 36a; a power source 38a such as a radio frequency generator; a process gas and plasma evacuation conduit 41a; and a plurality of radiant heating elements 40a. The operation of the foregoing elements is substantially identical to the operation of the similarly numbered elements in the continuous production system described with respect to FIG. 2 and, therefore, the description need not be repeated herewith. Note, that while, the sweep gas conduits 37 and the gas gates 42 serve no purpose in a batch processing system, the magnetic assemblies 50a are necessary to prevent canoeing or warping of the large area substrates 11a.

To form a single photovoltaic cell 10 illustrated in FIG. 1, whether in a continuous process apparatus, as in FIG. 2, a p-type semiconductor layer is deposited onto the substrate 11 in the deposition chamber 28, a substantially intrinsic amorphous semiconductor alloy layer is deposited atop the p-type layer in the deposition chamber 30 and n-type semiconductor alloy layer is deposited atop the intrinsic layer in the deposition chamber 32. As a result, in the preferred embodiment, the apparatus 26 deposits at least three semiconductor alloy layers onto the substrate 11 with the intrinsic layer deposited in deposition chamber 30 differing in composition from the layers deposited in deposition chambers 28 and 32 by the absence of at least one element which will be referred to as the dopant or doping species. Obviously, silicon alloys may be used to provide wider band gap films, while germanium alloys may be used to provide narrower band gap films.

It is important that each of the semiconductor layers and particularly the intrinsic layer deposited onto a surface of the substrate 11 be of high purity in order to produce high efficiency photovoltaic devices 10. It is therefore necessary to prevent the deposition of semiconductor layers which include either impurities from the process gases or contaminants from the walls of the deposition chambers. It is further advantageous not to deposit a film onto the substrate 11 until the deposition species in the ionized plasma exhibits the chemical combination, composition and bonding characteristics which will deposit a semiconductor layer exhibiting satisfactory electrical properties. It is to the end of satisfying the above criteria that the upstream cathode assembly of the instant invention is directed.

III

The Upstream Cathode System of the Present Invention

The upstream cathode system of the present invention is fully illustrated in FIGS. 3–6B. For ease of disclosure, the system will first be described as it is deployed in a batch process production machine, and then described as it is deployed in a continuous production machine with process gases introduced transversely and longitudinally to the direction of substrate travel.

A

The Batch Production Machine

Figure 3:
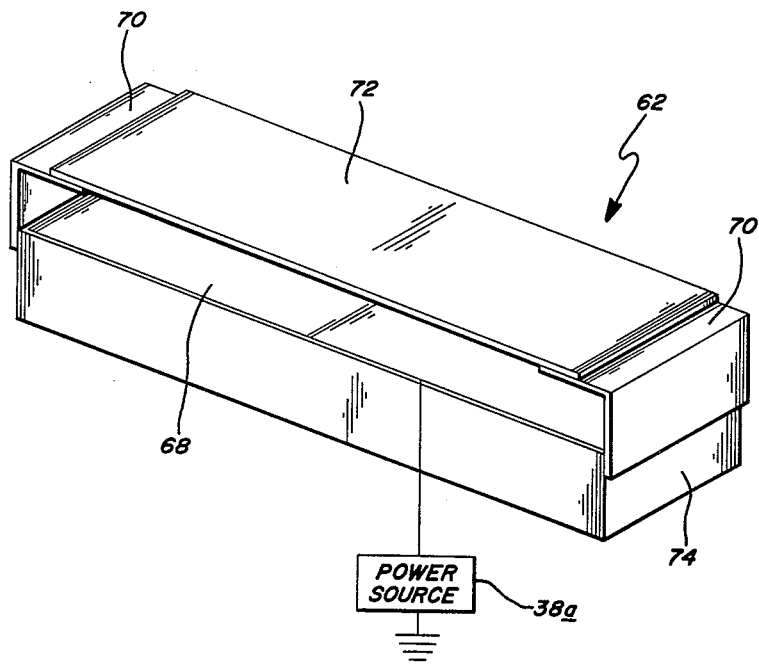
FIG. 3 is an enlarged perspective view of one embodiment of the upstream cathode system of the present invention, said upstream cathode system adapted for use with batch-type glow discharge deposition apparatus.

FIGS. 3 and 4A depict one embodiment of the upstream cathode system 62 of the present invention as adapted for use with a batch-type production machine 60, said machine having been previously described, with diagrammatic reference to FIG. 4, hereinabove.

Note that the upstream cathode system 62 is illustrated in FIG. 3 without reference to a downstream deposition cathode assembly because the system 62 need not be employed in the same chamber as the deposition cathode 34. In operation and with particular attention to FIG. 4A, process gases are pumped into a deposition chamber such as 28a, (a) through supply conduits 36a, (b) across the transverse upper surface of the large area substrate plate 11a, (c) around the upstream side edge 12a of the substrate plate 11a, (d) through the plasma region defined between the lower surface of the substrate plate 11a and the cathode 34a, and expelled along with nondeposited plasma from the deposition chamber 28a through evacuation conduit 41a (see FIG. 4). The process gases and plasma are substantially confined to the plasma region by the shield 35a which has an upper, generally L-shaped bracket 64 surrounding three sides of the substrate plate 11, said bracket 64 secured to a lower, three-sided enclosure 66. The enclosure 66 is attached to the floor 28b of the deposition chamber 28a to completely isolate the used process gases and nondeposited plasma. The substrate plate 11a rests on the shoulders of the L-shaped bracket 64.

Turning now specifically to FIG. 3, the upstream cathode system 62 may be shaped and dimensioned to substantially conform to the configuration and size of the downstream, deposition cathode assembly. The system 62 includes a precathode 68 powdered by an r.f. source (either the same source as, or a source in addition to, the one which powers the deposition cathode 34a); oppositely disposed, L-shaped brackets 70 on the top surface of which a collection plate 72, preferably formed of the same material as the 304 stainless steel substrate, (see FIG. 4A) rests; and a three-sided enclosure 74 to which the L-shaped brackets 70 are secured. The upstream cathode system 62 is operatively disposed so that the downstream edge 72a of the collection plate 72 abuts the upstream edge 12a of the substrate 11a. In a like manner, the downstream edges of the L-shaped brackets 70, the enclosure 74 and the upstream cathode 68 abut the upstream edges of the L-shaped brackets 64, the enclosure 66 and the deposition cathode, respectively, so as to prevent process gases or plasma from seeping through an opening so formed between the upstream cathode system 62 and the deposition cathode assembly.

By so forming and operatively disposing the upstream cathode system 62, the operation and gas flow pattern of the deposition cathode system remains unchanged. However, the upstream cathode system operates to create an upstream electromagnetic field and hence an upstream plasma region in which impurities are removed from the process gases and deposited onto the collection plate 72, contaminants are reoved from the walls of the deposition chamber 28a and deposited onto the collection plate 72, and the process gases begin their disassociation and recombination into ionized deposition species, whereby improved, stable semiconductor layers of substantially uniform and homogeneous composition are deposited onto the surface of the substrate plate 11a. Further, since contaminants appear to deposit from the plasma before the desired ionized deposition species, the reactivity of the ionized deposition species passing through the entire length of the deposition plasma region is much more uniform. The result is a more uniform rate of deposition across the entire surface of the substrate.

While the foregoing description dealt with the upstream cathode system in relation to an electromagnetic field developed by an r.f. powered cathode, the field may also be developed by a microwave generator without departing from the spirit or scope of the invention. Even when glow discharge deposition is achieved by microwave generation, it is still desirable to remove (1) impurities from the process gases, and (2) contaminants from the walls of the deposition chamber, and to have (3) a desired chemical combination, composition and bonding of process gases across the entire large area surface of the substrate.

Further, it is preferred, in the illustrated embodiment described herein, that the precathode 68 be powered by an r.f. power source discrete from the source which develops the deposition plasma. By employing a separate precathode power supply, a precathode power density of, for example, twice the value of the deposition cathode power density can be used to remove impurities from the process gases and contaminants from the deposition chamber walls.

Finally, note that the precathode system 62, in both the batch process and the continuous process apparatus, may be detached and physically spaced from the deposition cathode. The precathode may be either housed in a separate chamber upstream of the deposition chamber; or spaced by a matter of inches upstream of the deposition cathode. In either case, it serves identical functions, and both dispositions of the precathode may be employed without departing from the spirit of the present invention.

B

The Continuous Process Machine

Referring now to FIGS. 5 and 6, the upstream cathode system of the present invention is shown disposed for operation with the deposition elements of a continuous production machine such as the one diagrammatically shown in FIG. 2 and detailed hereinabove.

First, viewing the apparatus of FIG. 5, the process gases are directed in a direction of movement transverse (see arrow B) to the direction of movement of the web of the substrate material 11 (see arrow A) through the deposition chamber 29. The existing deposition cathode assembly of such glow discharge deposition apparatus need only be minimally modified to accommodate and function with the instant upstream cathode system 62. Specifically, the deposition chamber 29 includes a baffled process gas supply manifold 80 which comprises a plurality of staggered baffle plates 82 adapted to establish a tortuous path of travel for process gases entering the plasma region of the deposition chamber 29 from an apertured supply conduit 36. Adjacent the deposition cathode 34d in a direction transverse to movement of the web of substrate material 11, is the upstream or precathode 34p of the present invention. The upper surface 80a of the manifold 80 is elongated so that the edge 80e thereof is at least coextensive with the width of the precathode 34p. The precathode 34p cooperates with the overlying, extended manifold surface 80a to form an upstream plasma region through which the process gases must flow prior to entering the deposition plasma region. The process gases flowing through the upstream plasma region form a glow discharge plasma which is deposited onto the underside of the overhanging manifold surface 80a, or a similarly shaped collection plate secured thereto. The collecting surface 80a of the manifold 80 has deposited thereonto impurities from the process gases and contaminants from the walls of the deposition chamber 29, while the upstream electromagnetic field begins the chemical disassociation and recombination of process gases, whereby the semiconductor layer deposited onto the exposed surface of the web of substrate material 11 at the downstream deposition cathode 34d is substantially free of impurities and contaminants and of substantially uniform and homogeneous composition and reactivity.

As to the continuous deposition apparatus 26, including the upstream cathode assembly 62 of the present invention, illustrated in FIG. 6, note that the direction of flow of process gases (see arrow D) is substantially parallel to the direction of movement of the web of substrate material 11 through the plasma region of the deposition chamber 29 (see arrow E). In describing the parallel flow deposition apparatus of FIG. 6, the same reference numerals will be applied to elements substantially identical in function and structure as the elements described with respect to FIG. 5.

The deposition chamber 29 is generally rectangularly shaped with a back wall 29a, side walls 29b (only one of which is shown), and a bottom wall 29c. Supported on the bottom wall 29c are a pair of spaced, generally L-shaped support and shield members which include a generally upright wall 35c and a generally horizontally disposed, outwardly extending upper wall 35d. The end of the upright wall 35c rests upon and is supported by the bottom wall 29c of the deposition chamber 29, while the upper wall 35d is adapted to shield the edges of the deposition plasma region from the substrate 11 traveling thereover. Both of the longitudinal edges of the substrate 11 pass below and are urged into sliding contact with a flanged shoulder 35f of the gas confining shield 35 by the plurality of spaced magnet assemblies 50.

The deposition chamber 29 further includes an upstream plasma region formed in the area defined by the lower surface of the deposition cathode assembly 34d and the upper surface 35a of the base portion of the bottom chamber wall 29c which is generally disposed in a plane parallel to the plane of the deposition cathode 34d. It is a noteable feature of this embodiment of the invention that the upstream or precathode (these terms will be interchangeably used herein) plasma is obtained by capacitively coupling the deposition cathode plate 34a through a glass retainer plate 34b, as described in detail hereinbelow.

In the illustrated deposition cathode assembly 34d, electromagnetic energy such as radio frequency energy from a source 38 (see FIG. 2), is provided to the cathode plate 34a which is formed of an electrically conductive material. The electrically insulating glass sheet 34 both provides a rigid support for the stainless steel cathode plate 34a and insulates the cathode plate 34a from the grounded upright wall 35b of the shielding framework. It should be appreciated that a predeposition plasma region is thereby established between the bottom surface of the cathode plate 34a and the upper surface 35a of the bottom wall 29c of the deposition chamber 26. In a similar manner, and as depicted in FIG. 6A, a modified cathode assembly 34', can be formed of a plurality of alternating glass and metal layers. It is anticipated that such a multilayered cathode sandwich would be employed in a continuous deposition apparatus wherein the thickness of the deposited semiconductor layer requires a lengthy cathode past which the elongated web of substrate material 11 continuously passes. This multi-layered cathode assembly 34' has an intermediate insulating sheet 34b, such as glass, which is (1) positioned above and (2) substantially coextensive with the electrically conductive upper cathode plate 34a. The cathode assembly illustrated in FIG. 6A further includes an additional glass insulating sheet 34d positioned beneath and substantially coextensive with an electrode plate 34c which is capacitively coupled to cathode plate 34a. The inclusion of the glass sheet in the deposition cathode assembly 34' prevents deposition onto the lower electrode plate 34c when a precathode plasma is ignited.

Returning to FIGS. 6 and 6B, the deposition cathode assembly 34d is supported along three of its edges by L-shaped brackets 82 which are attached to the upright walls 35c of the gas confining shield 35. The fourth distal end of the deposition cathode assembly 34 is cantilevered from the upright wall 35c of the gas confining shield 35, thereby forming a passageway between the upstream precathode plasma region and the downstream decomposition plasma region. Since the gas confining shield 35 is grounded, and the electrode plate 34a is energized to a given electrical potential, electrical insulation must be provided to prevent short circuiting the deposition cathode assembly 34d to the grounded gas confining shield 35. This insulation may take the form of a strip of TEFLON (registered trademark of Dupont Corporation) 85 or other dielectric material interposed between the edge of the cathode assembly 34d and the upright wall 35b of the gas confining shield 35.

Because the deposition cathode assembly 34d is supported only along its edges, the entire surface area thereof is uncovered so that it may, in conjunction with the upper surface 35a of the bottom chamber wall 29c, establish a glow discharge plasma when the cathode plate 34a is energized.

Also included in the cathode region of the deposition apparatus 26 is one or more an apertured process gas supply conduits such as 36, the conduit 36 disposed adjacent the upright wall 35b at the end of the upstream plasma region opposite the passageway which interconnects the upstream plasma region with the deposition plasma region. The supply conduit 36 extends substantially across the entire width of the upstream plasma region, and includes a plurality of openings 36a through which the process gas is introduced. The process gases flowing through the upstream plasma region form an ionized glow discharge plasma from which impurities and contaminants deposit, along with partially disassociated and recombined species, onto the upper surface 35a of the bottom chamber wall 29c, said wall thus functioning as a collection plate. A discrete, removable collection plate could obviously be affixed to said upper surface 35a to facilitate cleanup operations, i.e., the periodic removal and replacement of the collection plate would remove deposited impurities and contaminants from the deposition chamber 29.

After flowing through the upstream plasma region, the purified process gases (being of similar reactivity) (1) are turned upwardly, (2) more in a direction of flow opposite their direction of flow through the upstream plasma region, and (3) are directed into the deposition plasma region which is defined by the upper surface of the cathode plate 34a and the deposition surface of the substrate 11. The path of travel through which the process gases are forced to pass, mixes those gases, thereby eliminating local variations in pressure and flow rate. In this manner, the tortuous path of travel serves substantially the same purpose as the baffled manifold 80 illustrated in FIG. 5 and described hereinabove.

It is essential to possess the capability of controlling the deposition rate in the upstream plasma region. The process gases must be subjected to the electromagnetic field for a sufficient length of time so as to (1) permit the removal of sufficient impurities and contaminants, and (2) achieve such disassociation and recombination that only high quality material is deposited onto the entire surface area of the substrate in the decomposition region. However, care must be taken not to deplete the concentration of process gases as said gases are deposited onto the substrate. Accordingly, while a high flow rate of process gases is provided (to prevent depletion of process gases due to differences in the time in which different gases have to be subjected to the electromagnetic field before deposition thereof) the length of time those gases are subjected to the effects of the upstream electromagnetic field and the strength of that electromagnetic field can be controlled. One method of controlling the time gases spend in the plasma region is to provide a grounded, masking plate in close proximity to the active surface of the upstream cathode plate 34a, thereby preventing a plasma from being generated over those portions of the cathode plate 34a which it covers. Obviously, by selecting a masking plate of a desired size and shape, only the plasma generated by the cathode plate 34a which is of preselected quality due to the length of time it has been subjected to the electromagnetic field, is actually deposited onto the substrate 11. In this manner, the amount of time the process gas is exposed to the upstream electromagnetic field can be selected to optimize the quality of deposited semiconductor material.

A second method of controlling the plasma which is deposited onto the substrate 11 is to apportion the relative amount of power delivered to the upstream plasma region and the downstream deposition plasma. As previously disclosed, this type of control is simple when the precathode and its related power supply are discrete from the deposition cathode and its power supply. They are simply adjusted independently. However, in the embodiment illustrated in FIG. 6, a single power source is employed, and control of the amount of power delivered from the upper and lower surfaces of the cathode plate 34a is controlled by varying the distance by which the cathode plate 34a is separated from the substrate 11, and from the bottom wall 29c of the deposition chamber 29, respectively. Adjusting the deposition cathode assembly 34d upwardly or downwardly will alter the power density of the upstream plasma relative to that of the plasma in the deposition plasma region. Toward this end, the L-shaped brackets 82 that support the deposition cathode assembly 34 are affixed to the upright walls 35b of the gas confining shield 35 by a plurality mounting bolts 84 which pass through adjustment slots 84a (see FIG. 6B) in the brackets 82. By loosening the bolts 84, the brackets 82 slide upwardly or downwardly, thus permitting the distance, and hence the strengths of the electromagnetic field established in the two plasma regions to be manipulated. Obviously, the power could also be adjusted by moving either the substrate 11, or the bottom chamber wall 29c relative to the deposition cathode assembly 34d. Alternatively, a grounded plate 34(e) can be inserted against the insulating sheet 34(b) to cover a portion of the upstream section of the cathode plate 34(a), thereby limiting the length of the effective precathode region.

The concept of utilizing the two opposing, planar surfaces of a single cathode plate, such as 34a, so as to have that single cathode plate serve both as a precathode and a deposition cathode has now been illustrated and described with reference to continuous deposition apparatus. However, the invention is not so limited, but would be equally suited for use in the batch processing apparatus of FIG. 4 by inserting a deposition cathode assembly such as assembly 34d, described hereinabove for the continuous apparatus, and repositioning the process gas supply conduits 36a to also function in a manner similar to the manifold 36 described hereinabove relative to the continuous apparatus.

Although the foregoing detailed description and the drawings have described the upstream cathode system in terms of a generally parallel, horizontally disposed cathode and collection plate combination, it should be obvious that nonhorizontally disposed and even non-parallel disposed cathode-collection plate combinations would operate in a manner identical to that described for the horizontal combination.

In operation, it is preferred, although not essential, that the upstream cathode assembly 62 be energized to develop a cleansing plasma prior to energization of the deposition cathode assembly 34d. In this manner the impurities and contaminants may be collected on an upstream collection surface rather than deposited onto the substrate 11.

When the deposition cathode assembly 34 is employed to fabricate amorphous semiconductor layers at rates of deposition as high as 30 angstroms per second in the deposition chamber 29 of FIG. 5, typical flow rates of 500 SCCM silane and 1000 SCCM molecular hydrogen are introduced through the gas supply conduits 36. The deposition chamber 29 is maintained at a background pressure of 0.6 to 1.2 torr and 250 watts of r.f. power is provided to energize the cathode plate 34a. The process gases are directed from the supply manifold 36 to pass through a full-length predeposition plasma region in which impurities and contaminants are removed and the disassociation and recombination of the gases into ionized deposition species occurs. In this manner, the ionized deposition species travelling through the deposition plasma region are both substantially free of impurities and contaminants and of substantially similar reactivity. By further providing sufficiently large passageways through which the process gases can travel in and about the cathode region of the deposition chamber, thereby avoiding stagnation in the plasma regions thereof, the amorphous silicon semiconductor material deposited onto the substrate 11 is (1) substantially uniform in quality and thickness across the entire surface of the substrate, (2) of high photovoltaic quality with increased voltage and a higher fill factor than previously produced, (3) free of powder particulate, and (4) of a much improved stability.

It should be understood that the present invention is not limited to the precise structure of the illustrated embodiments. It is intended that the foregoing description of the presently preferred embodiments be regarded as an illustration rather than as a limitation of the present invention. It is the claims which follow, including all equivalents, which are intended to define the scope of this invention.

What is claimed is: